United States Patent
Donlin

(10) Patent No.: US 7,353,474 B1
(45) Date of Patent: Apr. 1, 2008

(54) SYSTEM AND METHOD FOR ACCESSING SIGNALS OF A USER DESIGN IN A PROGRAMMABLE LOGIC DEVICE

(75) Inventor: Adam P. Donlin, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 210 days.

(21) Appl. No.: 11/405,903

(22) Filed: Apr. 18, 2006

(51) Int. Cl.
G06F 17/50 (2006.01)
G06F 15/177 (2006.01)
G06F 9/00 (2006.01)
G06F 11/263 (2006.01)
G06F 11/267 (2006.01)
G01R 13/28 (2006.01)

(52) U.S. Cl. .............. 716/4; 716/16; 716/18; 703/16; 713/2; 713/100; 714/32; 714/39; 714/732; 714/733

(58) Field of Classification Search ............ 716/4, 716/16, 18; 703/16; 713/1, 2, 100; 714/32, 714/39, 732, 733
See application file for complete search history.

(56) References Cited

U.S. PATENT DOCUMENTS

| | | | | |
|---|---|---|---|---|
| 5,603,043 A | * | 2/1997 | Taylor et al. ................ | 712/1 |
| 5,941,995 A | * | 8/1999 | Morrison .................... | 714/39 |
| 6,304,101 B1 | * | 10/2001 | Nishihara ................... | 326/41 |
| 6,453,456 B1 | * | 9/2002 | Price .......................... | 716/16 |
| 6,662,302 B1 | * | 12/2003 | Garey ........................ | 713/324 |
| 6,668,237 B1 | * | 12/2003 | Guccione et al. ........... | 702/119 |
| 6,826,717 B1 | * | 11/2004 | Draper et al. ............... | 714/39 |
| 7,007,250 B1 | * | 2/2006 | Bapat et al. ................. | 716/4 |
| 7,024,660 B2 | * | 4/2006 | Andrade et al. ............ | 717/124 |
| 7,126,373 B1 | * | 10/2006 | Schmit et al. ............... | 326/38 |
| 7,212,448 B1 | * | 5/2007 | Trimberger ............ | 365/189.02 |
| 7,301,836 B1 | * | 11/2007 | Raghavan et al. ......... | 365/201 |
| 2004/0139311 A1 | * | 7/2004 | Garey ........................ | 713/100 |

FOREIGN PATENT DOCUMENTS

EP 1363132 A2 * 11/2003

* cited by examiner

Primary Examiner—Phallaka Kik
(74) Attorney, Agent, or Firm—LeRoy D. Maunu

(57) ABSTRACT

Access to a signals of a user design in a programmable logic device (PLD) is provided without a compilation delay following selection of the signals. The system may include a generator, a compiler, a selector, the PLD, and a monitor. The generator selects sets of signals of the user design, and for each set of signals, generates a respective supplement of a subset of the user design supplementing the subset with a logic analyzer coupled to the set of signals. The compiler generates a respective configuration for each supplement. The selector selects a configuration or multiple configurations responsive to the specified set of signals and the sets of signals. The PLD implements the user design after the PLD is programmed with the selected configuration or configurations. The monitor accesses the specified set of signals in the PLD via the logic analyzer corresponding to each of the selected configuration or configurations.

20 Claims, 5 Drawing Sheets

SYSTEM AND METHOD FOR ACCESSING SIGNALS OF A USER DESIGN IN A PROGRAMMABLE LOGIC DEVICE

FIELD OF THE INVENTION

The present invention generally relates to verification of electronic designs.

BACKGROUND

The development of an electronic system includes designing the electronic system and verifying the proper operation of the electronic system. Simulation may be used to verify the proper operation of the electronic system. Simulation may provide excellent control of stimulus applied to the electronic system and ability to observe the resulting behavior of the electronic system. However, simulation may be slow, for example, simulation of one second of the operation of an electronic system may take may days, weeks, or even years of simulation time. Nevertheless, simulation is useful to discover and localize those defects in the electronic system that are detectable in a reasonable amount of simulation time.

Certain defects in the electronic system may be time-consuming to discover during simulation because the defects are not detectable in a reasonable amount of simulation time. A prototype of the electronic system may be used to discover and localize these defects. However, controlling the stimulus applied to the prototype of the electronic system may be challenging. In addition, expeditious localizing of a defect may require access to internal signals of the electronic system, and observing the behavior of these signals in the prototype may be time-consuming. For example, the design of a prototype environment may limit access to signals such that it may be simply impossible to access certain signals in the design under test.

An electronic design including a programmable logic device (PLD) has the advantage that the ability to observe internal signals of the electronic design in the PLD may be provided by certain tools, such as Chipscope available from Xilinx, Incorporated. A user of Chipscope may select a set of signals of a user design implemented on the PLD, and Chipscope provides access to these signals during operation of the electronic design. The access to internal signals in the PLD may expedite the localization of a defect in the electronic system.

Frequently, localization of a defect is an iterative process that traces from the symptom exhibiting the improper operation to the cause of the improper operation. For example, a particular signal may exhibit the improper operation for a defect. Examination of the logic generating this particular signal may indicate this logic is not the source of the defect, but that an input of this logic is the cause of the improper operation. Localizing a defect may require tracing back through many levels of logic to determine the defective logic that is the source of the improper operation. At each step of the iterative process, a different set of internal signals of the electronic design may need examination.

Each iteration examining a different set of signals may require a separate compilation step that translates the user design into a configuration for the PLD because Chipscope may include logic in the PLD to tap the particular signals being monitored. The separate compilation for each set of signals may be time-consuming, such that the localization of the defect is delayed.

The present invention may address one or more of the above issues.

SUMMARY OF THE INVENTION

Various embodiments of the invention provide a system for accessing a specified set of signals of a user design. The system may include a generator, a compiler, a selector, a programmable logic device (PLD), and a monitor. The generator selects sets of signals of the user design, and for each set of signals, generates a respective supplement of a subset of the user design that supplements the subset with a logic analyzer coupled to the set of signals. The compiler generates a respective configuration for each supplement. The selector selects a configuration or multiple configurations responsive to the specified set of signals and the sets of signals. The PLD implements the user design after the PLD is programmed with the selected configuration or configurations. The monitor accesses the specified set of signals in the PLD via the logic analyzer corresponding to each of the selected configuration or configurations.

Various other embodiments of the invention provide a method for accessing a specified set of signals of a user design in a programmable logic device (PLD). Sets of signals of the user design are selected, and for each set of signals, a respective supplement is generated of a subset of the user design supplemented with a logic analyzer coupled to the set of signals. A respective configuration is compiled for each supplement. At least one of the configurations is selected in response to the specified set of signals and the sets of signals. The PLD is programmed to implement the user design with the selected configurations. The specified set of signals is accessed in the PLD via the logic analyzer corresponding to each of the selected configurations.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

Figure 1:
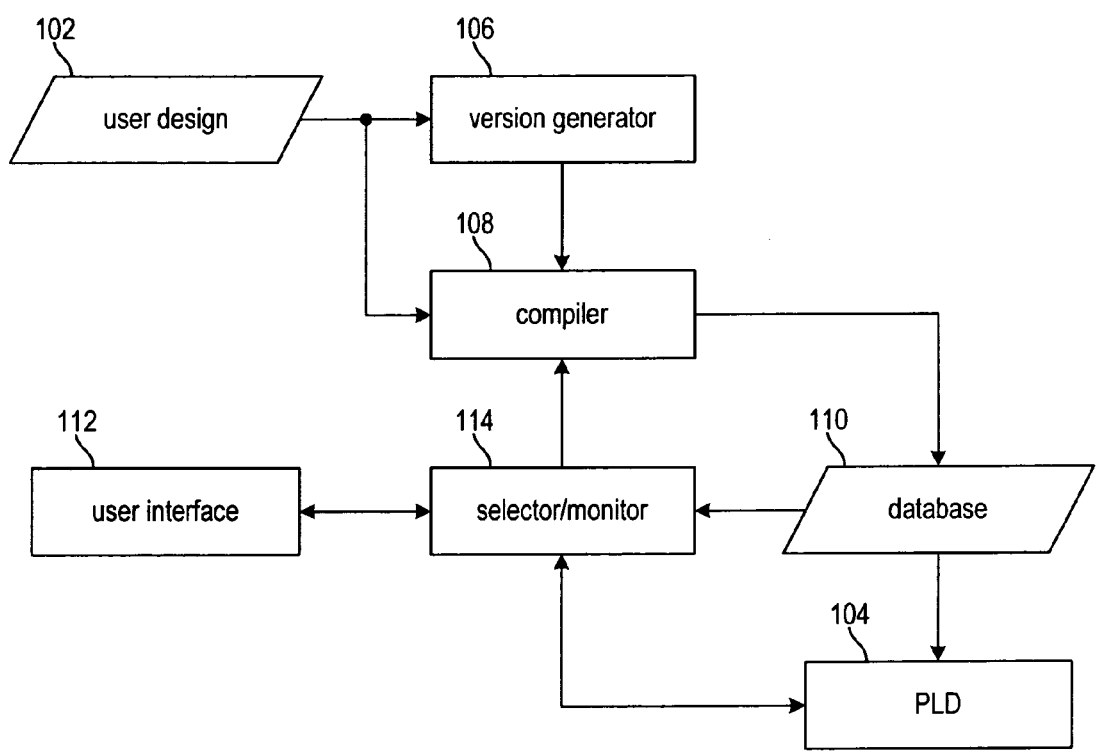
FIG. 1 is a block diagram of a tool flow for monitoring a set of signals in a programmable logic device (PLD) in accordance with various embodiments of the invention.

FIG. 1 is a block diagram of a tool flow for monitoring a set of signals in a programmable logic device (PLD) in accordance with various embodiments of the invention. Multiple configurations, which provide access to various sets of signals of the user design 102, may be generated before a user specifies the set of signals to be monitored. After the user specifies the set of signals to be monitored, the PLD 104 may be programmed to implement the user design and to provide access to the user specified set of signals using one or more of these configurations. Because the configurations may be generated before the user specifies the monitored signals of the user design 102, the user may experience a reduced delay between the specification of the monitored signals and the availability of the configuration that provides access to the specified signals. As compared to existing methods for compiling the user design together with circuitry for a logic analyzer, the speculative advance compilation of the multiple configurations may eliminate the wait after the monitored signals are selected.

A version generator 106 creates multiple versions of the user design 102. The version generator 106 selects sets of signals and generates a corresponding supplement of the user design 102 for each set of signals. For each set of signals, the corresponding supplement adds a logic analyzer module to the user design or a subset of the user design, with the logic analyzer coupled to the set of signals. For example, each module at each level of a hierarchy of modules for the user design 102 may have a corresponding supplement that includes circuits for monitoring the ports and/or local signals of the module. It will be appreciated that version generator 106 may create combinations of certain of the modules at a level of the hierarchy and/or across levels of the hierarchy, and generate a corresponding supplement of the user design 102 for each of these combinations. For example, each combination may be selected by version generator 106 to require slightly fewer resources for the circuitry to monitor the signals than the resources of PLD 104 that are not utilized by the user design 102.

Compiler 108 may generate a respective configuration for each supplement of the user design 102 that is generated by version generator 106, with each of these configurations stored in database 110 along with a specification of the set of signals that are monitored by the supplement. Compiler 108 may be a network of computers executing compiler software, with each supplement being compiled by one or more of the computers.

In one embodiment, each supplement adds a logic analyzer to the entire user design, such that the corresponding set of signals of the user design 102 may be accessed in the PLD 104 after programming the PLD 104 with the configuration for the supplement.

In another embodiment, the user design 102 is divided into subsets each having a corresponding set of signals, and a supplement is generated for each subset. Both the supplemented subsets and the non-supplemented subsets may be compiled in advance by compiler 108 and stored in database 110. Certain of the supplemented subsets and certain of the non-supplemented subsets may be combined to produce a configuration for the user design 102, such that each signal of a user-specified set of signals is monitored by one or more of the supplemented subsets.

A user may specify the signals to be monitored at a user interface 112 of a selector/monitor 114. The selector/monitor 114 may query database 110 to check whether the user-specified signals are a subset of one of the sets of signals monitored by the configurations from database 110. If the specified signals are a subset of the set of signals monitored by a configuration from database 110, the PLD 104 may be programmed with this configuration. The selector/monitor 114 may then obtain trace data from PLD 104 for the monitored signals, and display the trace data for the specified signals on the user interface 112. If the specified signals are not a subset of any one of the sets of signals monitored by the configurations from database 110, the selector/monitor 114 may prompt the user at user interface 112 to select another monitoring option, as discussed later.

Figure 2:
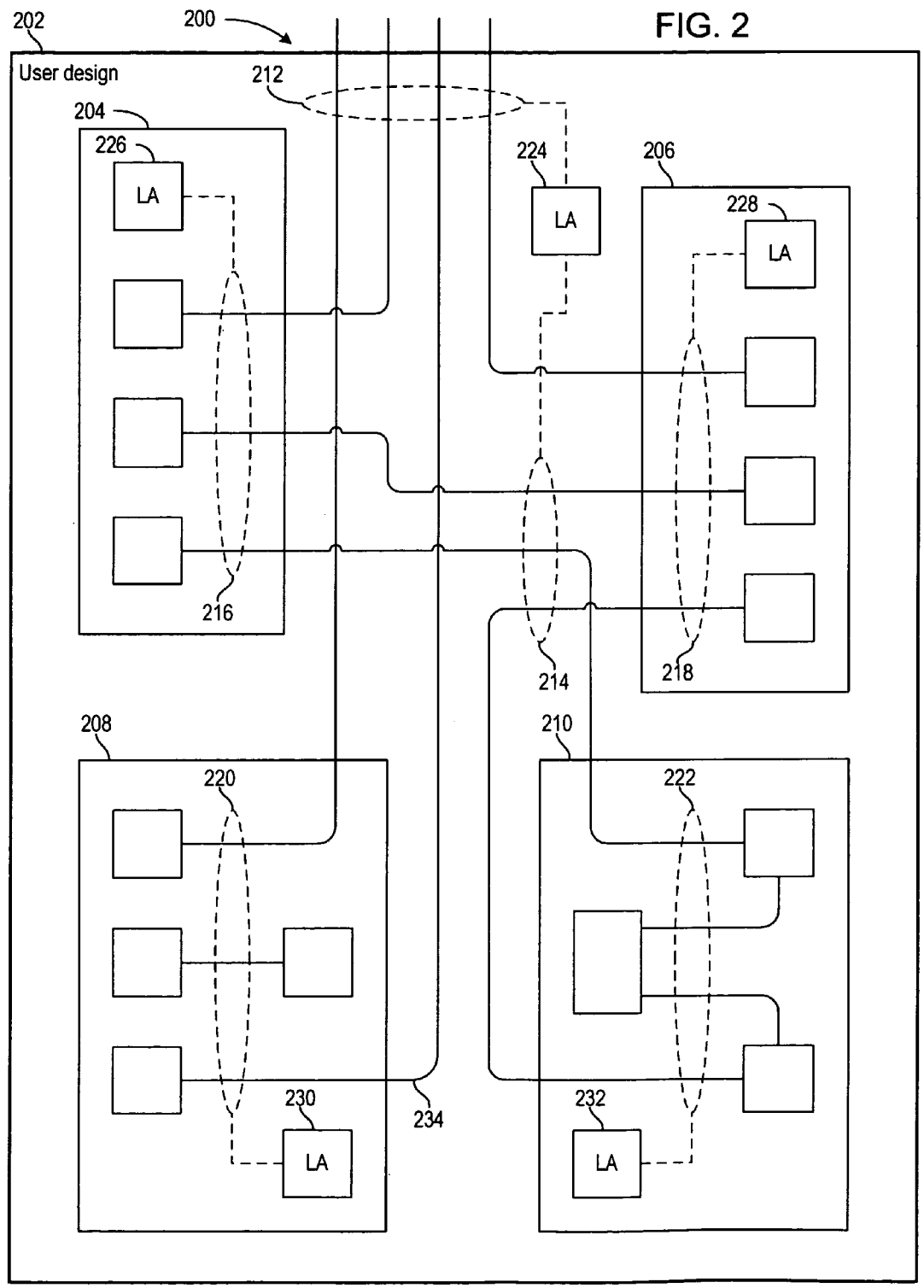
FIG. 2 is a block diagram of a supplemented user design illustrating access to example sets of signals in accordance with various embodiments of the invention.

FIG. 2 is a block diagram of a supplemented user design 200 illustrating access to example sets of signals in accordance with various embodiments of the invention. In one embodiment, the sets of signals correspond to the ports and local signals of each module, including the top-level module 202 and second-level modules 204, 206, 208, and 210. In this example, the five sets of signals may be a first set of ports and local signals of the top-level module 202, including input and output ports on lines 212 and local signals on lines 214 between second-level modules 204, 206, 208, and 210, a second set of ports on lines 216 of second-level module 204, a third set of ports on lines 218 of second-level module 206, a fourth set of ports and local signals on lines 220 of second-level module 208, and a fifth set of ports and local signals on lines 222 of second-level module 210. Each of the five sets of signals may have a corresponding logic analyzer 224, 226, 228, 230, and 232 that respectively monitors the signals on lines 212 and 214, lines 216, lines 218, lines 220, and lines 222.

In another embodiment, the set of signals correspond to combinations of the ports and local signals of each module 202, 204, 206, 208, and 210. For example, a PLD may have enough resources to supplement the original user design with circuitry for a logic analyzer that monitors up to eight signals. The sets of signals for each module 202, 204, 206, 208, and 210 may be combined to form combined sets of signals each having at most eight signals. For example, the combined sets of signals may be the two sets of signals having a first set of seven signals on lines 212 and 214, and a second set of six signals on lines 220 and 222. Thus, illustrated logic analyzers 230 and 232 may be combined into a single logic analyzer for the second set of signals and the illustrated logic analyzers 226 and 228 are not needed because the signals on lines 216 and the signals on lines 218 are included in the signals on lines 212 and 214 that are monitored by logic analyzer 224. Having fewer sets of signals may increase the likelihood that a user-specified set of signals is a subset of one of the sets of signals. It will be appreciated that a module having many ports and local signals may be split into multiple supplements each monitoring a portion of the ports and local signals.

In one embodiment, the entire original user design is supplemented with a respective logic analyzer for each set of signals. For example, a first supplement only includes logic analyzer 224 and the original user design and does not include logic analyzers 226, 228, 230, and 232, a second supplement only includes logic analyzer 226, a third supplement only includes logic analyzer 228, a fourth supplement only includes logic analyzer 230, and a fifth supplement only includes logic analyzer 232. Each of these five supplements may be speculatively compiled to generate a corresponding configuration before a user specifies the signals to be monitored.

The user may begin determining the cause of a defect by specifying the monitoring of the ports on lines 212 of the user design 202. Because a configuration may already be compiled for a supplement including the logic analyzer 224, this configuration may be loaded into the PLD to implement the user design while providing access to the ports on lines 212. The user may determine from the monitoring of the ports on lines 212 that the signal on line 234 has a protocol violation. Because the signal on line 234 with the protocol violation may be generated by second-level module 208, the user may next specify monitoring the ports and local signals of module 208. Because a configuration may already be compiled for a supplement including the logic analyzer 230, this configuration may be loaded into the PLD to implement the user design while providing access to the ports and local signals on lines 230 of module 208. The user may continue to trace the symptom of a defect back through various modules until the cause of the defect is determined. Because each set of signals of the iterative process of tracing from the symptom to the cause of a defect may have a corresponding supplement that is already compiled, determination of the cause of a defect may be expedited because compilation delays may be eliminated.

In another embodiment, various subsets of the original user design are supplemented with a logic analyzer monitoring signals of the subset. For example, a first subset may include the logic in top-level module 202 that is not in second-level modules 204, 206, 208, and 210, and second, third, fourth, and fifth subsets may respectively include the logic included in second-level modules 204, 206, 208, and 210. A respective partial configuration may be generated for each subset, such that a configuration that implements the original user design may be generated by combining the five partial configurations for the five subsets. It the partial configuration are already available, the combining of the partial configurations may require substantially less time that a full compilation of the original user design. Two partial configurations may be speculatively generated for each subset, with one partial configuration being supplemented with a logic analyzer monitoring signals of the subset and the other partial configuration not being supplemented with a logic analyzer.

After the user specifies the monitored signals, a group of supplemented subsets may be determined that monitors all of the user-specified signals. The partial configurations for these supplemented subsets are combined with the non-supplemented partial configurations for the other subsets to produce a configuration that implements the user design and provides access to the user-specified signals. If the user changes the monitored signals and all of the new signals are not already included in the current combined configuration, an appropriate combination of supplemented and non-supplemented partial configurations are combined to produce a configuration that implements the user design and provides access to the user-specified signals. A check may be made to estimate or determine whether the PLD has sufficient resources to implement the combination of the partial configurations. When the PLD does not have sufficient resources, the user may be prompted to select another monitoring option, as discussed later.

Figure 3:
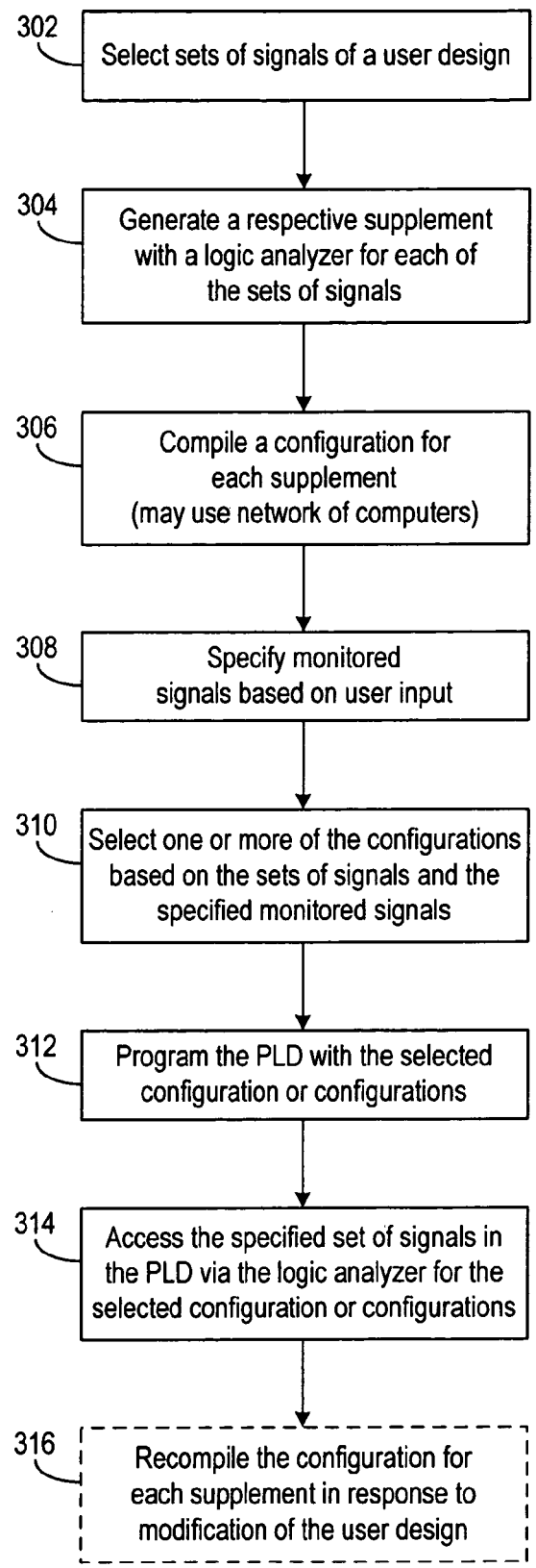
FIG. 3 is a flow diagram of a process for accessing a set of signals of a user design in a PLD in accordance with various embodiments of the invention.

FIG. 3 is a flow diagram of a process for accessing a set of signals of a user design in a PLD in accordance with various embodiments of the invention. When a user specifies the signals to be monitored, one or more configurations, which may be speculatively generated in advance, are selected. The PLD is programmed with the selected configurations, such that the PLD implements the user design and provides access to the user-specified signals.

At step 302, various sets of signals of the user design are selected. The selected sets may be automatically generated and include the ports and local signals for each module of the user design, or the ports and local signals for various combinations of the modules of the user design. Alternatively, each set of selected signals may include all the signals of a particular module and every module included within the hierarchy for the particular module. It will be appreciated that the sets of signals may be selected in various other manners, such as tracking previously used sets of signals. At step 304, a respective supplement is generated for each set of signals that includes a logic analyzer that monitors each signal of the set. At step 306, a configuration is generated for each supplement and the configuration may be generated before a user specifies the signals to be monitored at step 308. In certain embodiments, the configuration generated for each supplement is a partial configuration and a corresponding non-supplemented partial configuration also may be generated.

At step 308, a user may specify a set of signals that are to be monitored in a PLD implementing the user design. At step 310, one or more of the configurations are selected based on the sets of signals selected at step 302 and the user-specified signals. When one of the configurations compiled in step 306 includes a supplement that monitors all of the user-specified signals, this configuration may be selected at step 310. At step 312 the PLD is programmed with the configuration or configurations selected at step 310. At step 314, the user design is implemented in the programmed PLD and the user-specified signals are monitored via the logic analyzer that is included in the selected configuration or configurations.

In one embodiment, the tool may be optionally configured to automatically monitor the user design for modifications as shown by step 316. When the user design is modified, some or all of steps 302 through 306 may be repeated automatically to create updated configurations for the modified user design. During intermediate stages in the modification of a user design by a designer, the designer may introduce errors that prevent the successful completion of certain of steps 302 through 306. Generally, the designer is not notified of any such errors that are detected while attempting to repeat steps 302 through 306. Instead, the errors may be ignored and when another modification of the user design is detected, some or all of steps 302 through 306 may be repeated again. After a designer has made a final modification to the user design, the designer may take some time to review the changes to ensure the changes are complete, and during this review time a new collection of configurations may be generated at step 306, especially if the compilation at step 306 is performed by a network of many computers. By the time the designer wants to test the user design because the designer believes the modifications are complete, the new collections of configurations may be available, and testing of the modified user design can begin without delay.

Figure 4:
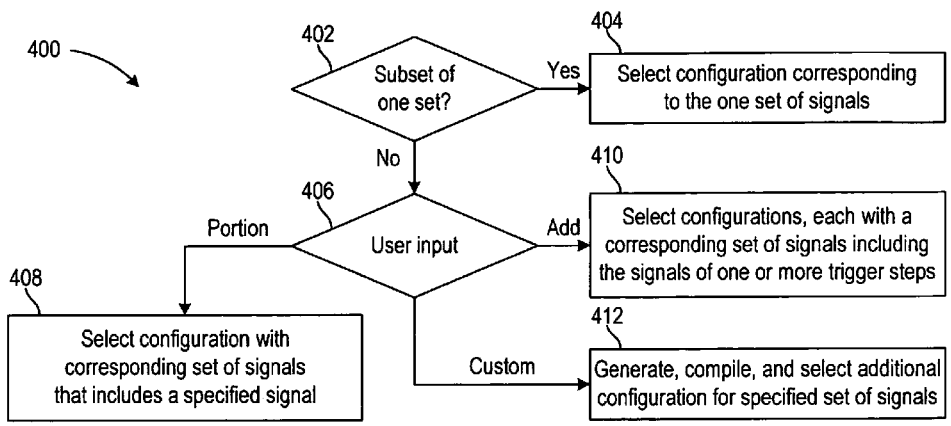
FIG. 4 is a flow diagram of a process for selecting a configuration for a user design in accordance with various embodiments of the invention.

FIG. 4 is a flow diagram of a process 400 for selecting a configuration for a user design in accordance with various embodiments of the invention. In an embodiment having configurations that include the entire original user design supplemented with a logic analyzer monitoring a respective set of signals, process 400 may correspond to step 310 of FIG. 3 for the configurations generated at step 306 of FIG. 3.

Decision 402 checks whether the user-specified signals are a subset of one of the sets of signals. When the user-specified signals are a subset of one of the sets of signals, process 400 proceeds to step 404 and otherwise process 400 proceeds to decision 406. At step 404, a set of signals that includes at least the user-specified signals is selected along with the corresponding configuration.

Decision 406 checks for a user response to a prompt to select a monitoring option. The user may be prompted to select one of three options for selecting a configuration for the user design, and depending upon the user selection, process 400 may proceed to step 408, 410, or 412.

For a user selection to monitor a portion of the user-specified signals, a listing of configurations, which may be ordered, for example, according to a number of the user-specified signals that are monitored by each configuration, may be presented to the user at step 408. A user may evaluate the signals that are monitored and the user-specified signals that are not monitored, and the user may select one of the configurations that monitors a portion of the user-specified signals. Alternatively, the configuration that monitors the greatest number of user-specified signals may be selected at step 408 without further input from the user. It will be appreciated that when the available configurations do not provide acceptable monitoring, the user may return to decision 406 and select another monitoring option.

For a user selection to monitor the user-specified signals by successively using multiple configurations, process 400 proceeds from decision 406 to step 410. The user design may have repeatable behavior, such that the user design may exhibit the same behavior starting from a particular initial condition each time a particular stimulus is provided to the inputs of the user design. For such a repeatable user design and input stimulus, a union of certain of the sets of signals that includes every user-specified signal may be determined, and the PLD may be successively programmed with the corresponding configurations for each set of the union to collectively monitor all of the user-specified signals beginning from the particular initial condition. The traces from each configuration may be combined to form a unified trace including all of the user-specified signals.

Frequently, tracing the behavior of a user design includes starting the collection of trace information at or near a trigger condition. The trigger may be a simple trigger that searches for a single trigger event, such as a transaction on a communication bus that accesses a particular address, or a complex trigger that searches for a sequence of trigger events before beginning the trace. Generally, each trigger event should be dependent upon signals that are included in one of the configurations, and a complex trigger may use a sequence of configurations for each trigger event. The sequence of configurations used for a complex trigger may link each trigger event using a transition trigger. For example, each configuration may count a number of clock cycles from the initial condition to the trigger event, and the transition trigger for the next configuration may wait for this number of clock cycles before activating the search for the next trigger event. After detecting the final trigger event in the complex trigger at a final count between the initial condition and the final trigger event, additional configurations may be used to collect trace data before and/or after a wait having the number of clock cycles of the final count.

In one embodiment using multiple configurations for a complex trigger and/or for collecting trace data to be combined into a unified trace of the user-specified signals, the user design does not begin from the initial condition for each of the multiple configurations. Instead, the current state of the user design is read at the appropriate time from, for example, the first configuration and this current state is written to the second configuration and operation of the user design is continued.

For a user selection to create a custom configuration that monitors the user-specified signals, process 400 proceeds from decision 406 to step 412. An additional supplement of the user design with a logic analyzer that monitors the user-specified signals is created, and this additional supplement is compiled to generate an additional configuration. The user may need to wait for the compiling of the additional supplement to complete when this monitoring option is selected. However, as soon as the user has specified the signals to be monitored, generation of this additional configuration can begin before the user has provided any input at decision 406. Speculatively compiling this additional configuration may reduce the amount of compilation delay that is apparent to the user. This additional configuration may be added to a database of configurations that is checked should the user modify the signals to be monitored. In addition, the user may be notified when the additional configuration becomes available if the user has selected monitoring a portion of the user-specified signals at step 408 or the accumulation of the user-specified signals from multiple traces at step 410.

Figure 5:
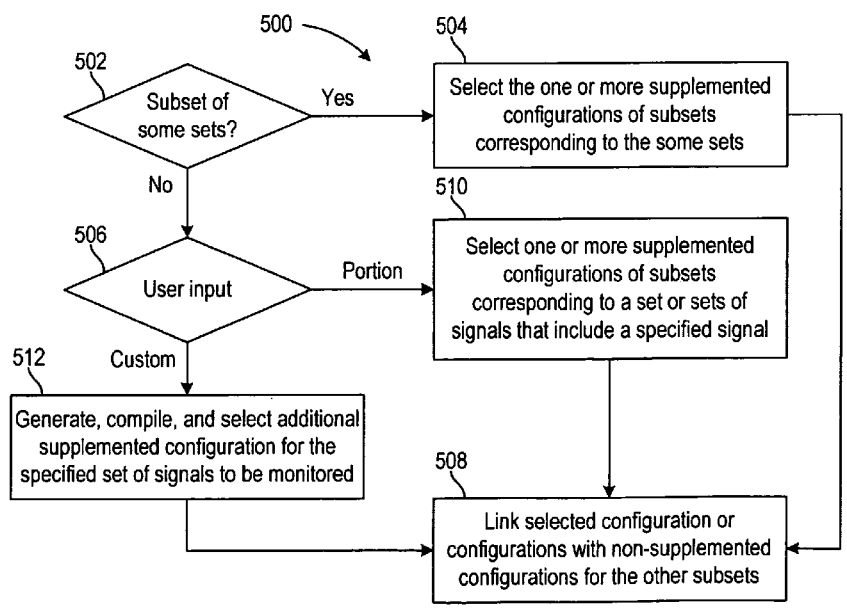
FIG. 5 is a flow diagram of a process for selecting and linking supplemented and non-supplemented configurations for subsets of a user design in accordance with various embodiments of the invention.

FIG. 5 is a flow diagram of a process 500 for selecting and linking supplemented and non-supplemented configurations for subsets of a user design in accordance with various embodiments of the invention. In an embodiment having configurations that are partial configurations including a subset of the user design supplemented with a logic analyzer monitoring a respective set of signals, process 500 may correspond to step 310 of FIG. 3 for the supplemented and non-supplemented partial configurations generated at step 306 of FIG. 3.

Decision 502 checks whether the user-specified signals to be monitored are a subset of a union of some of the sets of signals, each of these sets of signals having a corresponding supplemented partial configuration that includes a logic analyzer that monitors the set of signals. If the user-specified signals are a subset of a union of some of the sets of signals, process 500 proceeds to step 504 and otherwise process 500 proceeds to decision 506. At step 504, the supplemented partial configurations are selected that monitor the sets of signals that are included in the union.

The amount of PLD resources needed to monitor the user-specified signals may be reduced by including only the supplemented partial configurations that are necessary to ensure that all of the user-specified signals are monitored. A prediction may be made whether the PLD has sufficient resources to implement the user design using the selection of supplemented partial configurations. More supplemented partial configurations may be selected to monitor more signals when the predication indicates a surplus of resources, and the user may be notified to select another monitoring option when the predication indicates insufficient resources. At step 508, the selected supplemental partial configurations are combined with sufficient non-supplemented partial configurations to create a configuration that implements the complete user design while providing access to the user-specified signals.

In one embodiment, the original user design can be created by linking together all the non-supplemented partial configurations, with each non-supplemented partial configuration having a corresponding supplemented partial configuration, such that either the supplemented or non-supplemented version of all of the partial configurations are selected. In another embodiment, either the supplemented or non-supplemented version of some of the available partial configurations are combined to created a configuration that implements the user design and provides access to the user-selected signals.

At decision 506, user input selecting a monitoring option may be checked and process 500 may proceed to either step 510 or step 512 depending on the user input. For a user selection to monitor a portion of the user-specified signals, a portion of the sets of signals may be determined at step 510 that monitors as many of the user specified signals as is possible within the available resources of the PLD, and corresponding partial configurations are selected. At step 508, the supplemented partial configuration and linked with a non-supplemented partial configuration to create a configuration that implements the user design and provides access to some or all of the user-specified signals.

For a user selection to create a custom partial configuration that monitors the user-specified signals, additional supplemented partial configurations for monitoring the user-specified signals of each subset may be created at step 512, and combined with existing non-supplemented partial configurations at step 508.

Figure 6:
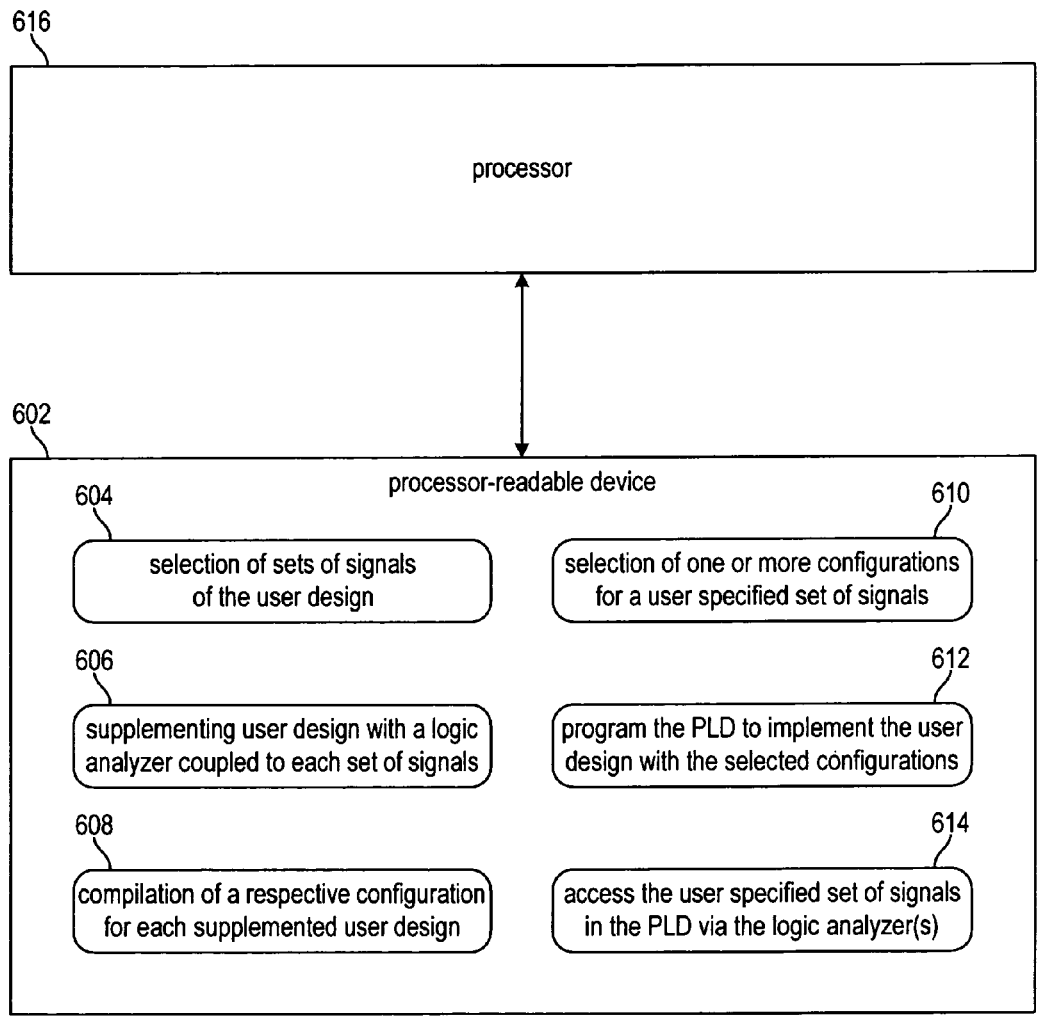
FIG. 6 is a block diagram of a system for accessing a set of signals of a user design in accordance with various embodiments of the invention.

FIG. 6 is a block diagram of a system for accessing a set of signals of a user design in accordance with various embodiments of the invention. The processor-readable device 602 may be a program storage medium including various software modules 604 through 614 for accessing a user specified set of signals. The software modules 604 through 614 may perform a corresponding function when executed by processor 616.

Software module 604 may select sets of signals of the user design for various subsets of the user design. For each set of signals, software module 606 may supplement the user design or the subset of the user design with a logic analyzer that is coupled to monitor the set of signals. Software module 608 may compile each supplement to generate a respective configuration for a PLD. Software module 610 may select one or more of these configurations in response to a user specification of signals to be monitored. Software module 612 may program the PLD with the selected one or more configurations, such that the PLD implements the user design and provides access to some or all of the user-specified set of signals. Software module 614 accesses the user-specified signals or a subset of the user-specified signals during the operation of the user design in the PLD. The user-specified signals may be accessed via the logic analyzers included in the selected one or more configurations. Access to the user-specified signals may include displaying a trace of the user-specified signals at a user interface of the processor 616.

Various embodiments of the present invention are described in terms of accessing signals of a user design implemented in PLD. Those skilled in the art will appreciate, however, that the invention could be implemented in various PLD architectures, such a field programmable gate arrays, integrated circuits that include programmable logic circuitry and/or adapted to various application requirements, based on both volatile and non-volatile technologies.

Those skilled in the art will appreciate that various alternative computing arrangements, including one or more processors and a memory arrangement configured with program code, would be suitable for hosting the processes and data structures of the different embodiments of the present invention. In addition, the processes may be provided via a variety of computer-readable media or delivery channels such as magnetic or optical disks or tapes, electronic storage devices, or as application services over a network.

The present invention is thought to be applicable to a variety of systems for accessing signals of a user design implemented in PLD. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A system for accessing a specified set of signals of a user design, comprising:
    a generator adapted to select a plurality of sets of signals of the user design, and for each set of signals, to generate a respective supplement of a subset of the user design that supplements the subset with a logic analyzer coupled to the set of signals;
    a compiler adapted to generate a respective configuration from each supplement;
    a selector adapted to select at least one of the configurations responsive to the specified set of signals and the sets of signals;
    a programmable logic device (PLD) adapted to implement the user design after programming the PLD with the at least one of the configurations; and
    a monitor adapted to access the specified set of signals in the PLD via the logic analyzer corresponding to each of the at least one of the configurations.

2. The system of claim 1, wherein each respective supplement includes all of the user design.

3. The system of claim 1, wherein the generator is further adapted, for each module at a particular level in a hierarchy of the user design, to select a respective one of the sets of signals that includes a plurality of ports of the module.

4. The system of claim 3, wherein each respective supplement includes from the user design only the module for the set of signals.

5. The system of claim 1, wherein the compiler is further adapted to generate a respective configuration for each subset of the user design.

6. The system of claim 1, wherein the selector is further adapted to select one of the configurations that corresponds to the one of the sets of signals, responsive to the specified set of signals being a subset of one of the sets of signals.

7. The system of claim 1, wherein the selector is further adapted to select the configurations that correspond to the plurality of the sets of signals, responsive to the specified set of signals being a subset of a union of a plurality of the sets of signals.

8. The system of claim 7, wherein the compiler is further adapted to also generate a respective configuration for each subset of the user design, and the selector is further adapted, for each subset, to select one of the respective configuration for the subset and the respective configuration for the supplement of the subset.

9. The system of claim 1, wherein the selector is further adapted to select the configurations that correspond to the sets of signals that have a non-null intersection with the specified set of signals, responsive to the specified set of signals not being a subset of a union of the sets of signals.

10. A method for accessing a specified set of signals of a user design in a programmable logic device (PLD), comprising:
    selecting a plurality of sets of signals of the user design;
    for each set of signals, generating a respective supplement of a subset of the user design that supplements the subset with a logic analyzer coupled to the set of signals;
    compiling a respective configuration from each supplement;
    selecting at least one of the configurations in response to the specified set of signals and the sets of signals;

programming the PLD with the at least one of the configurations, wherein the programmed PLD implements the user design; and accessing the specified set of signals in the PLD via the logic analyzer corresponding to each of the at least one of the configurations.

11. The method of claim 10, further comprising receiving as input from a user data that indicates the specified set of signals.

12. The method of claim 10, further comprising checking for modification of the user design and repeating the compiling in response to the modification of the user design.

13. The method of claim 10, wherein the compiling uses a network of a plurality of computers, each supplement being compiled by at least one of the computers.

14. The method of claim 10, further comprising compiling a respective configuration for each subset of the user design, wherein the selecting, for each subset of the user design, selects one of the respective configuration for the subset of the user design and the respective configuration for the supplement of the subset of the user design.

15. The method of claim 10, further comprising accepting user input in response to the specified set of signals not being a subset of one of the sets of signals.

16. The method of claim 15, wherein the selecting selects one of the configurations corresponding to one of the sets of signals that includes at least one signal from the specified set of signals, in response to the user input.

17. The method of claim 15, further comprising, in response to the user input, generating an additional supplement that supplements the user design with a logic analyzer coupled to the specified set of signals, wherein the compiling compiles an additional configuration for the additional supplement and the selecting selects the additional configuration.

18. The method of claim 15, wherein the selecting selects, in response to the user input, a plurality of the configurations corresponding to a plurality of the sets of signals that includes a respective set of signals for each step in a specified trigger that controls the accessing of the specified set of signals in the PLD.

19. The method of claim 18, wherein the programming the PLD with the at least one of the configurations includes sequentially programming the PLD with each one of the plurality of configurations, and the accessing of the specified set of signals in the PLD includes sequentially accessing the plurality of the respective set of signals for each step via the logic analyzer corresponding to the one of the plurality of configurations.

20. A program storage medium, comprising:

a processor-readable device configured with instructions, wherein execution of the instructions by one or more processors causes the one or more processors to perform operations responsive to input from a user, the operations including, selection of a plurality of sets of signals of a user design, for each set of signals, generation of a respective supplement of a subset of the user design that supplements the subset with a logic analyzer coupled to the set of signals, compilation of a respective configuration from each supplement, selection of at least one of the configurations in response to a specified set of signals and the sets of signals, programming of the PLD with the at least one of the configurations, wherein the programmed PLD implements the user design, and accessing the specified set of signals in the PLD via the logic analyzer corresponding to each of the at least one of the configurations.

* * * * *